(12) United States Patent
Hall, Jr. et al.

(10) Patent No.: US 10,604,227 B2
(45) Date of Patent: Mar. 31, 2020

(54) SOLAR PANEL WINDOW ASSEMBLY AND METHOD OF FORMING THE SAME

(71) Applicant: The Boeing Company, Chicago, IL (US)

(72) Inventors: Curtis L. Hall, Jr., Summerville, SC (US); David A. Lutz, Ladson, SC (US)

(73) Assignee: THE BOEING COMPANY, Chicago, IL (US)

( * ) Notice: Subject to any disclaimer, the term of this patent is extended or adjusted under 35 U.S.C. 154(b) by 198 days.

(21) Appl. No.: 15/670,824

(22) Filed: Aug. 7, 2017

(65) Prior Publication Data

US 2019/0039714 A1    Feb. 7, 2019

(51) Int. Cl.
| | |
|---|---|
| *H02J 7/00* | (2006.01) |
| *H02J 7/14* | (2006.01) |
| *B64C 1/14* | (2006.01) |
| *H01L 31/05* | (2014.01) |
| *B64D 27/24* | (2006.01) |
| *B64D 27/26* | (2006.01) |
| *H02J 7/35* | (2006.01) |
| *H02S 20/30* | (2014.01) |
| *H01L 31/048* | (2014.01) |
| *H02S 20/22* | (2014.01) |

(52) U.S. Cl.
CPC .......... *B64C 1/1484* (2013.01); *B64C 1/1492* (2013.01); *B64D 27/24* (2013.01); *B64D 27/26* (2013.01); *H01L 31/0488* (2013.01); *H01L 31/0504* (2013.01); *H02J 7/35* (2013.01); *H02S 20/22* (2014.12); *H02S 20/30* (2014.12)

(58) Field of Classification Search
USPC .......................................... 320/101, 114, 115
See application file for complete search history.

(56) References Cited

U.S. PATENT DOCUMENTS

| | | |
|---|---|---|
| 3,012,294 A | 12/1961 | Waldor |
| 4,294,038 A | 10/1981 | Davidson |
| 6,039,390 A | 3/2000 | Agrawal et al. |

(Continued)

OTHER PUBLICATIONS

Lending, Jamie, "This fully transparent solar cell could make every window and screen a power source", www.ExtremeTech.com, Apr. 20, 2015.

(Continued)

*Primary Examiner* — Alexis B Pacheco
(74) *Attorney, Agent, or Firm* — Moore IP Law

(57) ABSTRACT

A solar panel window assembly for an aircraft and method of forming such assembly includes an outer window panel and an inner window panel mounted in a window frame structure. The window frame structure holds the outer window panel spaced from and parallel to the inner window panel. A solar panel is mounted on an inner surface of the window frame structure between the outer window panel and the inner window panel. A foam kit may be mounted between the solar panel and the window frame structure. The inner window panel may be an electrically dimmable window panel. The solar panel may be coupled to power the electrically dimmable window panel. In addition, an alternative solar panel window assembly includes a window plug assembly adapted to fit into a window aperture in an aircraft and a solar panel mounted on an outer surface of the window plug assembly.

20 Claims, 4 Drawing Sheets

(56) References Cited

U.S. PATENT DOCUMENTS

| | | | | |
|---|---|---|---|---|
| 6,646,196 B2* | 11/2003 | Fronek | ............... | E06B 7/28 |
| | | | | 136/244 |
| 9,578,686 B2 | 2/2017 | Apdalhaliem et al. | | |
| 9,976,726 B2* | 5/2018 | Ash | ............... | B64C 1/1492 |
| 2005/0268962 A1* | 12/2005 | Gaudiana | ............ | H01L 25/047 |
| | | | | 136/255 |
| 2008/0230653 A1* | 9/2008 | Mitchell | ............... | B60J 3/04 |
| | | | | 244/129.3 |
| 2008/0236654 A1* | 10/2008 | Pietrangelo | ............ | E06B 3/68 |
| | | | | 136/251 |
| 2009/0173008 A1* | 7/2009 | Huang | ............... | E06B 7/086 |
| | | | | 49/74.1 |
| 2014/0130848 A1* | 5/2014 | Takechi | ............ | H01L 31/048 |
| | | | | 136/251 |
| 2014/0251411 A1* | 9/2014 | Ganti | ............... | H01L 31/18 |
| | | | | 136/246 |
| 2014/0253012 A1* | 9/2014 | Bauer | ............... | B64C 1/1492 |
| | | | | 320/101 |
| 2016/0137282 A1* | 5/2016 | Hontz | ............... | B64D 47/00 |
| | | | | 244/129.3 |

OTHER PUBLICATIONS

Lamonica, Martin, "Transparent plastic solar cells fitted into windows", www.cnet.com, May 11, 2009.

Kim, Soo, "The plane window that could charge your mobile phone", www.telegraph.co.uk, Jun. 2016.

* cited by examiner

SOLAR PANEL WINDOW ASSEMBLY AND METHOD OF FORMING THE SAME

FIELD

This disclosure relates generally to a solar panel window assembly and a method of forming a solar panel window assembly, and specifically to a solar panel window assembly for use in generating electricity in an aircraft and a method of forming a solar panel window assembly for use in generating electricity in an aircraft.

BACKGROUND

Window assemblies in aircraft having pressurized cabins typically include a cavity formed between an outboard structural window that is flush to the aircraft's exterior skin and an inboard transparent window adjacent to the interior cabin sidewall panels. This cavity is sealed by a peripheral seal. The peripheral seal typically includes a significant area which is always exposed to outside light.

In some aircraft configurations, window holes are filled with plugs in areas of the aircraft dedicated to full-height internal structures (also called monuments).

Solar panels are used for harvesting solar energy. However coupling solar panels to exterior of an aircraft introduces aerodynamic drag during flight. It is desirable to use solar energy harvesting systems comprising solar panels to generate electricity for use onboard an aircraft Accordingly, there is a need for a system and method which overcomes the problems recited above.

SUMMARY

In a first aspect, a solar panel window assembly for an aircraft has an outer window panel, an inner window panel, and a window frame structure adapted to hold the outer window panel spaced from and parallel to the inner window panel. In addition, a solar panel is mounted on an inner surface of the window frame structure between the outer window panel and the inner window panel.

In a further embodiment, a foam kit may be mounted between the solar panel and the window frame structure. In another, further embodiment, the inner window panel may be an electrically dimmable window panel and the solar panel may be coupled to power the electrically dimmable window panel. Still further, an electrical storage device may be provided, with the solar panel coupled to charge the electrical storage device. User controls may be coupled between the electrical storage device and the electrically dimmable window panel to allow an amount of dimming of the electrically dimmable window panel to be adjusted. The electrical storage device may be a battery or a capacitor.

The window frame structure may be formed from a solid material or a series of clips. The inner surface of the window frame structure may be angled towards the outer window panel.

In a second aspect, a method of forming a solar panel window assembly for an aircraft includes mounting a solar panel over an inner surface of a window frame structure. Next, an outer window panel is installed into the window frame structure. Finally, an inner window panel is installed into the window frame structure so that the outer window panel is spaced from and parallel to the inner window panel. A foam kit may be mounted over the inner surface of the window frame structure prior to the mounting step such that the foam kit is mounted between the inner surface of the window frame structure and the solar panel.

In a third aspect, a solar panel window assembly for an aircraft has a window plug assembly adapted to fit into a window aperture in an aircraft and a solar panel mounted on an outer surface of the window plug assembly.

The features, functions, and advantages that have been discussed can be achieved independently in various embodiments or may be combined in yet other embodiments, further details of which can be seen with reference to the following description and drawings.

BRIEF DESCRIPTION OF THE DRAWINGS

The following detailed description, given by way of example and not intended to limit the present disclosure solely thereto, will best be understood in conjunction with the accompanying drawings in which.

DETAILED DESCRIPTION

In the present disclosure, like reference numbers refer to like elements throughout the drawings, which illustrate various exemplary embodiments of the present disclosure.

Figure 1:
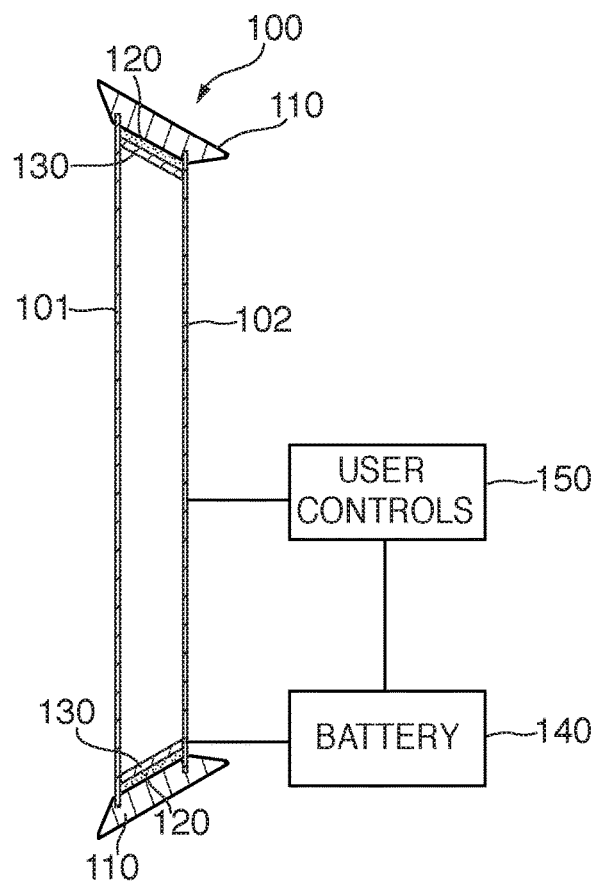
FIG. 1 is a side view of a first embodiment of a solar panel window assembly according to the present disclosure.

Referring now to FIG. 1, a first embodiment of a solar panel window assembly 100 includes an outer window panel 101 and an inner window panel 102 mounted in a window frame structure 110. Window frame structure 110 may be formed from a solid material or a series of clips. A foam kit 120 is used to seal the inner portion (shroud) of the solar panel window assembly 100. Finally, a solar panel 130 is mounted over the foam kit 120 mounted on the shroud. When the solar panel window assemblies 100 are installed in an aircraft, each solar panel 130 is coupled to an electrical distribution system (not shown) in a conventional manner to provide a source of auxiliary power for the aircraft. In particular, the electrical power from the solar panels 130 can be used to power window shading options, interior lighting, and other interior power needs. This reduces the load on an aircraft's Auxiliary Power Unit, reduces the aircrafts weight by requiring shorter runs for electrical wiring and provides simpler and easily modified electrical wiring runs. In a further embodiment, inner window panel 102 may be an electrically dimmable window panel and solar panel 130 may be used, in conjunction with appropriate electrical circuitry, to power the electrically dimmable window panel. For example, solar panel 130 may be coupled to charge a local electrical storage device 140 such as a battery or capacitor that is used to selectively power the electrically dimmable window panel using user controls 150.

Figure 2:
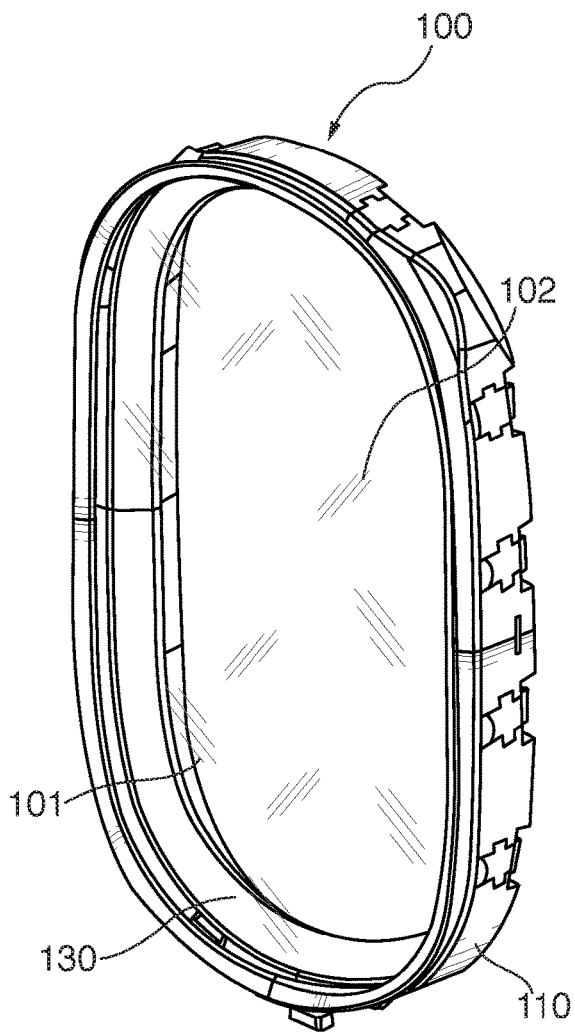
FIG. 2 is a perspective view of the first embodiment of a solar panel window assembly according to the present disclosure.

Referring now to FIG. 2, a side perspective view of solar panel window assembly 100 shows solar panel 130 mounted over the foam kit panel 120 (not shown in FIG. 2) on window frame structure 110. Solar panel 130 has significant surface area (e.g., about forty square inches for a typical aircraft window). Many commercial aircraft include about 100 windows, so an aircraft including solar panel window assemblies 100 mounted in each window hole can have 4,000 square inches of area of solar panel surface area, allowing the generation of a significant amount of electrical power.

Figure 3A:
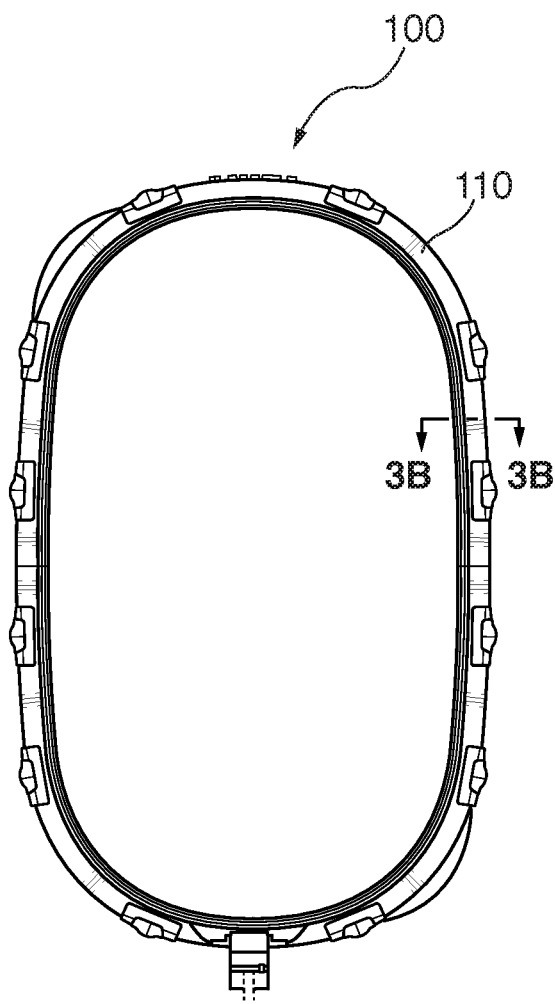
FIG. 3A is a rear view of the first embodiment of a solar panel window assembly according to the present disclosure.
Figure 3B:
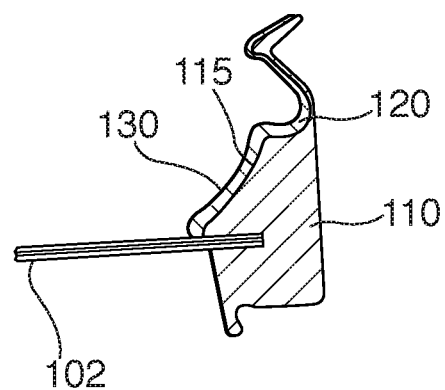
FIG. 3B is a view in detail of the portion indicated by section lines 3-3 in FIG. 3A.

FIG. 3A is a rear view of solar panel window assembly 100 showing section lines 3-3 in window frame structure 110. FIG. 3B shows inner window panel 102 mounted in window frame structure 110, with foam kit 120 mounted over the inside surface 115 of window frame structure 110 and solar panel 130 mounted over foam kit 120. Since the inside surface 115 of window frame structure 110 is angled towards the outer window panel 101, solar panel 130 is orientated to receive outside sunlight.

Figure 4A:
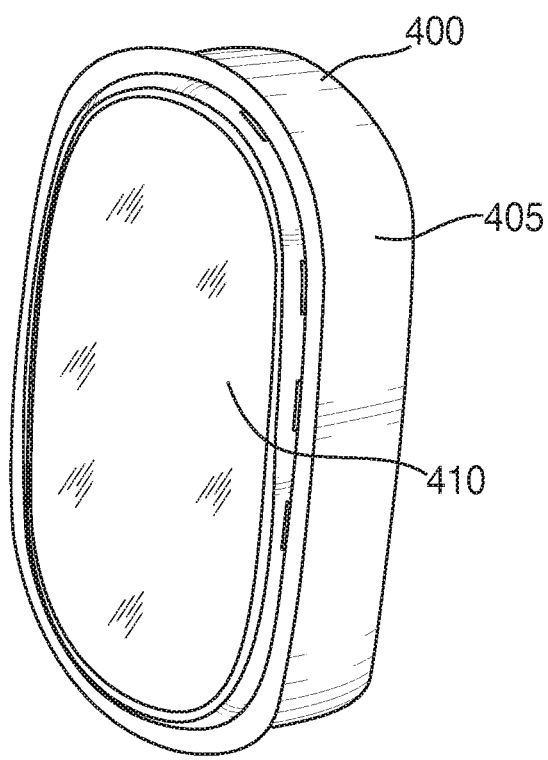
FIG. 4A is a perspective view of a second embodiment of a solar panel window assembly according to the present disclosure.
Figure 4B:
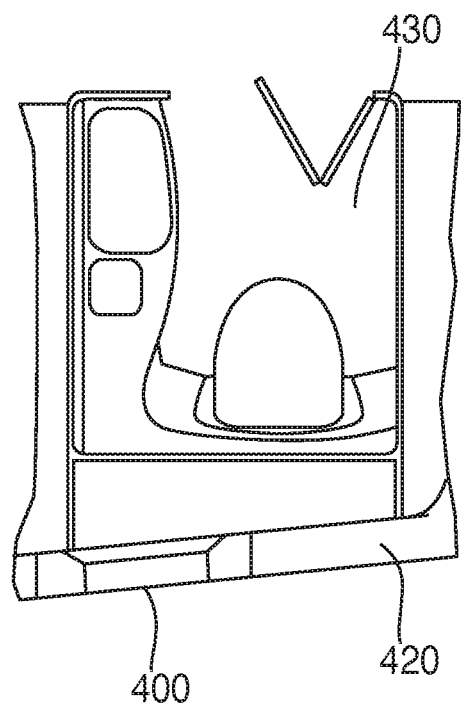
FIG. 4B is an overhead cutaway view of the second embodiment of a solar panel window assembly installed in an aircraft.

Referring now to FIGS. 4A and 4B, a second embodiment of a solar panel window assembly 400 includes a window plug 405 and a solar panel 410 mounted over the outside facing surface of window plug 405. Solar panel window assembly 410 is for use in areas of an aircraft having a full-height internal monument (structure) 430 mounted against the outer boundary of an aircraft adjacent to certain window apertures. Solar panel window assembly 400 is mounted in such apertures in the outer wall 420 of an aircraft. Each solar panel 410 in solar panel window assembly 400 may have 165 square inches of exposed surface area. A typical commercial aircraft may have four to six apertures requiring window plugs, so the use of solar panel window assemblies 400 in an aircraft can add 825 to 990 square inches of solar panel area, contributing significantly to the amount of electrical energy supplied for use in internal aircraft systems.

Figure 5:
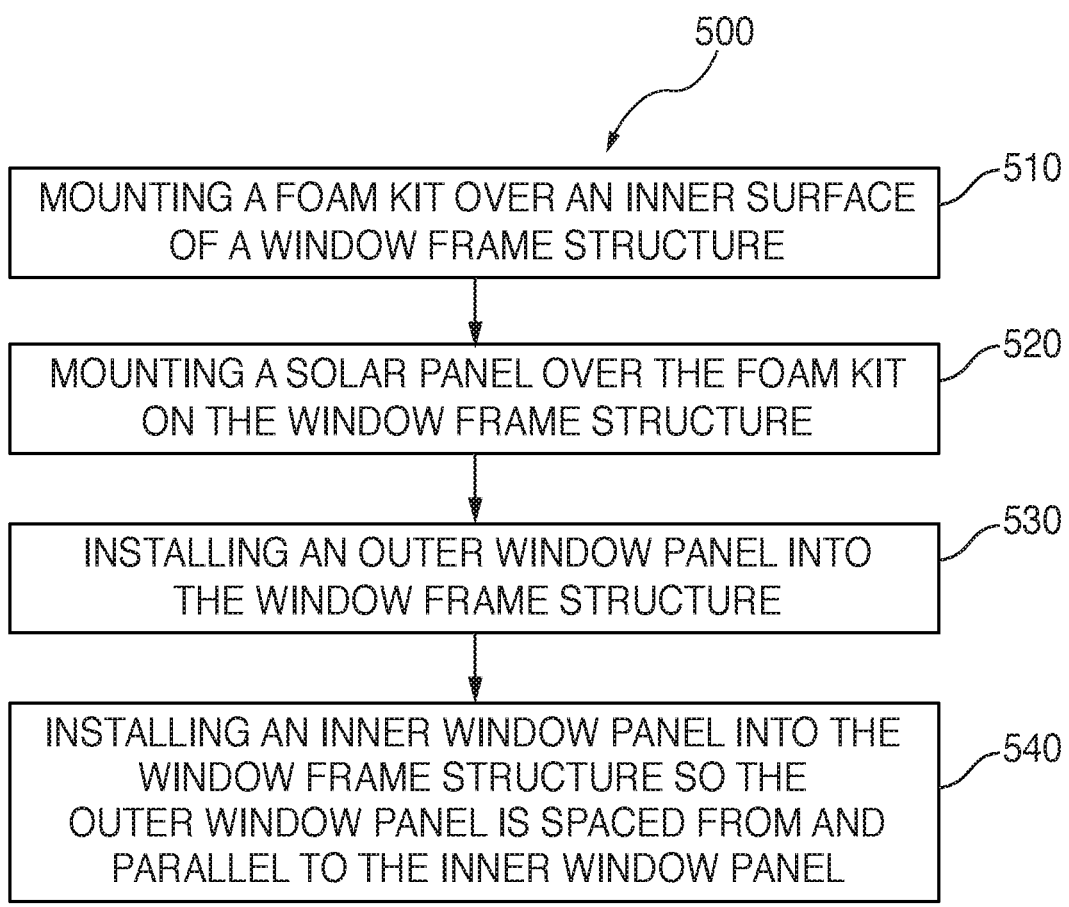
FIG. 5 is a flowchart of a method for providing a solar panel window assembly according to the present disclosure.

Referring now to the flowchart 500 in FIG. 5, a method of providing a solar panel window assembly includes a first step 510 where a foam kit is mounted over an inner surface of a window frame structure. Next, at step 520, a solar panel is mounted over the foam kit on the inner surface of the window frame structure. Further, at step 530, an outer window panel is installed into the window frame structure. Finally, at step 540, an inner window panel is installed into the window frame structure so the outer window panel is spaced from and parallel to the inner window panel.

Although the present disclosure has been particularly shown and described with reference to the preferred embodiments and various aspects thereof, it will be appreciated by those of ordinary skill in the art that various changes and modifications may be made without departing from the spirit and scope of the disclosure. It is intended that the appended claims be interpreted as including the embodiments described herein, the alternatives mentioned above, and all equivalents thereto.

What is claimed is:

1. A solar panel window assembly for an aircraft, comprising:
   an outer window panel;
   an inner window panel;
   a window frame structure configured to hold the outer window panel parallel to the inner window panel; and
   a solar panel mounted on an inner surface of the window frame structure, the inner surface between the outer window panel and the inner window panel, wherein the solar panel is non-parallel and non-perpendicular with the outer window panel.

2. The solar panel window assembly of claim 1, further comprising a foam kit mounted between the solar panel and the window frame structure.

3. The solar panel window assembly of claim 1, wherein the inner window panel comprises an electrically dimmable window panel.

4. The solar panel window assembly of claim 3, wherein the solar panel is electrically coupled to the electrically dimmable window panel.

5. The solar panel window assembly of claim 3, further comprising an electrical storage device, wherein the solar panel is electrically coupled to the electrical storage device.

6. The solar panel window assembly of claim 5, further comprising user controls coupled between the electrical storage device and the electrically dimmable window panel, the user controls configured to adjust an amount of dimming of the electrically dimmable window panel.

7. The solar panel window assembly of claim 5, wherein the electrical storage device comprises a battery.

8. The solar panel window assembly of claim 5, wherein the electrical storage device comprises a capacitor.

9. The solar panel window assembly of claim 1, wherein the window frame structure is formed from a solid material.

10. The solar panel window assembly of claim 1, wherein the window frame structure is formed from a series of clips.

11. The solar panel window assembly of claim 1, wherein the inner surface of the window frame structure is angled towards the outer window panel.

12. A method of forming a solar panel window assembly for an aircraft, comprising the steps of:
   mounting a solar panel over an inner surface of a window frame structure;
   installing an outer window panel into the window frame structure, wherein the solar panel is non-parallel and non-perpendicular with the outer window panel; and
   installing an inner window panel into the window frame structure, the inner window panel installed parallel to the outer window panel, and wherein the inner surface is between the outer window panel and the inner window panel.

13. The method of claim 12, further comprising mounting a foam kit over the inner surface of the window frame structure prior to mounting the solar panel, wherein the foam kit is mounted between the inner surface of the window frame structure and the solar panel after the solar panel is mounted.

14. The method of claim 12, wherein the inner window panel comprises an electrically dimmable window panel.

15. The method of claim 14, further comprising electrically coupling the solar panel to the electrically dimmable window panel.

16. The method of claim 14, further comprising electrically coupling an electrical storage device to the solar panel so that the solar panel charges the electrical storage device.

17. The method of claim 16, further comprising electrically coupling user controls between the electrical storage device and the electrically dimmable window panel, the user controls configured to adjust an amount of dimming of the electrically dimmable window panel.

18. The method of claim 16, wherein the electrical storage device comprises a battery.

19. The method of claim 16, wherein the electrical storage device comprises a capacitor.

20. The solar panel window assembly of claim 1, wherein a plane perpendicular to the outer window panel, at a lower perimeter edge of the outer window panel, runs through the outer window panel and the solar panel.

* * * * *